United States Patent
Jeong et al.

(10) Patent No.: US 8,933,477 B2
(45) Date of Patent: Jan. 13, 2015

(54) LIGHT EMITTING DEVICE HAVING PROTRUSIONS FROM A CONDUCTIVE SUPPORT MEMBER LIGHT EMITTING DEVICE PACKAGE, AND LIGHTING SYSTEM

(71) Applicant: LG Innotek Co., Ltd., Seoul (KR)

(72) Inventors: Joo Young Jeong, Seoul (KR); Young Kyu Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/874,348

(22) Filed: Apr. 30, 2013

(65) Prior Publication Data

US 2013/0240940 A1 Sep. 19, 2013

Related U.S. Application Data

(63) Continuation of application No. 12/948,445, filed on Nov. 17, 2010, now Pat. No. 8,502,248.

(30) Foreign Application Priority Data

Feb. 18, 2010 (KR) ........................ 10-2010-0014706

(51) Int. Cl.
| | |
|---|---|
| H01L 33/00 | (2010.01) |
| H01L 33/58 | (2010.01) |
| H01L 33/42 | (2010.01) |
| H01L 33/44 | (2010.01) |
| G02F 1/03 | (2006.01) |
| G02F 1/07 | (2006.01) |
| F21V 7/04 | (2006.01) |

(52) U.S. Cl.
CPC ............... *H01L 33/58* (2013.01); *H01L 33/42* (2013.01); *H01L 33/44* (2013.01); *H01L 33/0079* (2013.01)
USPC ................ 257/98; 257/99; 359/247; 362/612

(58) Field of Classification Search
CPC ............................. H01L 33/48; H01L 25/075
See application file for complete search history.

(56) References Cited

U.S. PATENT DOCUMENTS

| | | |
|---|---|---|
| 6,774,071 B2 | 8/2004 | Horner, Jr. et al. |
| 2005/0062049 A1 | 3/2005 | Lin et al. |
| 2007/0295952 A1 | 12/2007 | Jang et al. |
| 2010/0090237 A1* | 4/2010 | Jeong .............................. 257/98 |
| 2010/0102350 A1 | 4/2010 | Jeong |
| 2010/0207151 A1* | 8/2010 | Jeong .............................. 257/98 |

FOREIGN PATENT DOCUMENTS

| | | |
|---|---|---|
| CN | 101485000 A | 7/2009 |
| JP | 2000-36621 A | 2/2000 |

(Continued)

*Primary Examiner* — Michael Jung
(74) *Attorney, Agent, or Firm* — Birch, Stewart, Kolasch & Birch, LLP

(57) ABSTRACT

Disclosed is a light emitting device. The light emitting device includes a light emitting structure layer including a first semiconductor layer, an active layer, and a second semiconductor layer, an electrode electrically connected to the first semiconductor layer, an electrode layer under the light emitting structure layer, and a conductive support member under the electrode layer. A channel layer is between the second semiconductor layer and the electrode layer. A protrusion projected from at least one of edges of the conductive support member includes and having a rough surface.

20 Claims, 9 Drawing Sheets

(56) References Cited

FOREIGN PATENT DOCUMENTS

| KR | 10-2006-0125079 | A  | 12/2006 |
| KR | 10-0774198      | B1 | 11/2007 |
| WO | WO 2009/082121  | A2 | 7/2009  |
| WO | WO 2009/084860  | A2 | 7/2009  |

* cited by examiner

LIGHT EMITTING DEVICE HAVING PROTRUSIONS FROM A CONDUCTIVE SUPPORT MEMBER LIGHT EMITTING DEVICE PACKAGE, AND LIGHTING SYSTEM

The present application is a Continuation of co-pending U.S. patent application Ser. No. 12/948,445 filed on Nov. 17, 2010, which claims priority under 35 U.S.C. §119(a) of Korean Patent Application No. 10-2010-014706 filed on Feb. 18, 2010, which is hereby incorporated by reference in its entirety.

BACKGROUND

The embodiment relates to a light emitting device, a light emitting device package, and a lighting system.

Groups III-V nitride semiconductors have been extensively used as main materials for light emitting devices, such as a light emitting diode (LED) or a laser diode (LD), due to the physical and chemical characteristics thereof. In general, the groups III-V nitride semiconductors include a semiconductor material having a compositional formula of $In_x Al_y Ga_{1-x-y}N$ ($0 \leq x \leq 1$, $0 \leq y \leq 1$, and $0 \leq x+y \leq 1$).

The LED is a semiconductor device, which transmits/receives signals by converting an electric signal into infrared ray or light using the characteristics of compound semiconductors. The LED is also used as a light source.

The LED or the LD using the nitride semiconductor material is mainly used for the light emitting device to provide the light. For instance, the LED or the LD is used as a light source for various products, such as a keypad light emitting part of a cellular phone, an electric signboard, and an illumination device.

SUMMARY

The embodiment provides a light emitting device capable of improving light extraction efficiency.

The embodiment provides a light emitting device including a protrusion projecting from an edge of a support member under a light emitting structure layer.

The embodiment provides a light emitting device including a concave part recessed inward from a lateral surface of a support member.

The embodiment provides a light emitting device package having a light emitting device and a lighting system.

According to the embodiment, the light emitting device includes a light emitting structure layer including a first semiconductor layer, a second semiconductor layer under the first semiconductor layer and an active layer between the first and second semiconductor layers; an electrode electrically connected to the first semiconductor layer; an electrode layer under the light emitting structure layer; a conductive support member under the electrode layer; a first protrusion protruded from at least one of edges of the conductive support member; and a channel layer disposed between a top surface of the conductive support member and a lower surface of the second semiconductor layer, wherein the channel layer includes an opening region under the lower surface of the second semiconductor layer and an outer portion extended outward beyond the lower surface of the second semiconductor layer, wherein the outer portion of the channel layer is located at a lower position than the lower surface of the second semiconductor layer, wherein the first protrusion includes at least one of materials constituting the electrode layer and the conductive support member, wherein the first protrusion has a rough surface and is contacted with the channel layer, wherein the first protrusion is located at an outer position than a lateral sidewall of the second semiconductor layer.

According to the embodiment, the light emitting device includes a light emitting structure layer including a first semiconductor layer, a second semiconductor layer under the first semiconductor layer and an active layer between the first and second semiconductor layers; an electrode electrically connected to the first semiconductor layer; an electrode layer under the light emitting structure layer; and a conductive support member under a lower surface of the second semiconductor layer, wherein the conductive support member includes a first protrusion protruded from at least one of edges of the conductive support member and a recess region recessed inward from at least one of lateral sidewalls of the conductive support member, wherein the first protrusion includes at least one of materials constituting the electrode layer and the conductive support member, wherein the first protrusion has a rough surface and is located at an outer position than a lateral sidewall of the second semiconductor layer.

DETAILED DESCRIPTION OF THE EMBODIMENTS

Figure 1:
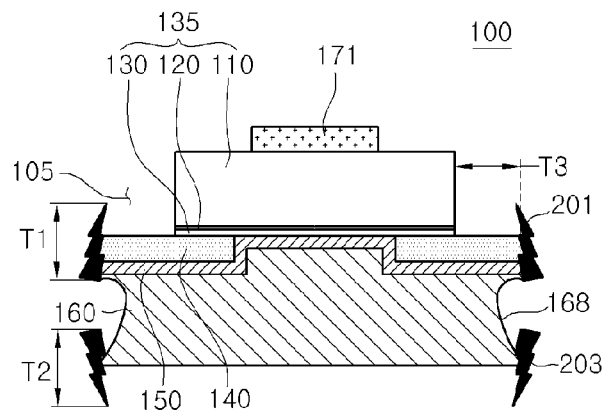
FIG. 1 is a sectional view showing a light emitting device according to the first embodiment.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each layer shown in the drawings may be exaggerated, omitted or schematically drawn for the purpose of convenience or clarity. In addition, the size of elements does not utterly reflect an actual size.

FIG. 1 is a sectional view showing a light emitting device 100 according to a first embodiment.

Referring to FIG. 1, the light emitting device 100 includes a light emitting structure layer 135, a first electrode 171, a channel layer 140, an electrode layer 150, a conductive support member 160, a first protrusion 201, and a second protrusion 203.

The light emitting device 100 is a semiconductor light emitting device including a plurality of compound semiconductor layers. The semiconductor light emitting device includes an LED (Light Emitting Diode), and the LED may include a color LED to emit blue, red, or green light or a UV LED.

The light emitting structure layer 135 includes a plurality of compound semiconductor layers. For instance, the light emitting structure layer 135 includes a first semiconductor layer 110, an active layer 120, and a second semiconductor layer 130.

The first semiconductor layer 110 may include compound semiconductors of group III-V elements doped with first conductive type dopants. For instance, the first semiconductor layer 110 may include a semiconductor material having a compositional formula of $In_xAl_yGa_{1-x-y}N$ ($0 \leq x \leq 1$, $0 \leq y \leq 1$, $0 \leq x+y \leq 1$). For instance, the first semiconductor layer 110 may include one selected from the group consisting of GaN, AlN, AlGaN, InGaN, InN, InAlGaN, AlInN, AlGaAs, GaP, GaAs, GaAsP, and AlGaInP. The first semiconductor layer 110 is an N type semiconductor, and the first conductive dopants include an N type dopant such as Si, Ge, Sn, Se, or Te. The first semiconductor layer 110 may have a single layer structure or a multi-layer structure. If the first semiconductor layer 110 has a multi-layer structure, at least one layer may include an undoped layer.

A first electrode 171 is formed on the first semiconductor layer 110, and has the form of a pad and/or a pattern having a predetermined shape. The first electrode 171 may be provided at a central portion or an outer portion of an upper portion of the first semiconductor layer 110. The first electrode 171 may have an outer appearance in a circular shape or a polygonal shape. The first electrode 171 may further include an arm pattern. The first electrode 171 may be arranged at another region other than the upper portion of the first semiconductor layer 110, and may be electrically connected to the first semiconductor layer 110.

The first electrode 171 may have a single layer structure or a multi-layer structure including one selected from the group consisting of Ti, Al, In, Ta, Pd, Co, Ni, Si, Ge, Ag and Au.

The active layer 120 may be interposed between the first semiconductor layer 110 and the second semiconductor layer 130, and may include at least one of a single quantum well structure, a multiple quantum well structure, a quantum wire structure and a quantum dot structure.

The active layer 120 may have a stack structure including well and barrier layers which are made of a compound semiconductor of group III-V elements. For instance, the active layer 120 may have a stack structure of InGaN well/GaN barrier layers, InGaN well/AlGaN barrier layers, or InGaN well/InGaN barrier layers, but the embodiment is not limited thereto. The bandgap of the barrier layer may be higher than that of the well layer.

A conductive clad layer may be formed on and/or under the active layer 120. The conductive clad layer may include a GaN-based semiconductor. The bandgap of the conductive clad layer may be higher than the bandgap of the barrier layer.

The second semiconductor layer 130 is formed under the active layer 120, and may include compound semiconductors of group III-V elements doped with second conductive type dopants. For instance, the second semiconductor layer 130 may include a semiconductor material having a compositional formula of $In_xAl_yGa_{1-x-y}N$ ($0 \leq x \leq 1$, $0 \leq y \leq 1$, and $0 \leq x+y \leq 1$). For instance, the second semiconductor layer 130 may include one selected from the group consisting of GaN, AlN, AlGaN, InGaN, InN, InAlGaN, AlInN, AlGaAs, GaP, GaAs, GaAsP, and AlGaInP. If the second conductive type is a P type semiconductor, the second conductive type dopants include a P type dopant such as Mg, or Zn. The second semiconductor layer 130 may have a single layer structure or a multi-layer structure, but the embodiment is not limited thereto. If the second semiconductor layer 130 has a multi-layer structure, at least one layer may include an undoped layer.

The first semiconductor layer 110, the active layer 120, and the second semiconductor layer 130 may be defined as the light emitting structure layer 135.

In addition, a semiconductor layer having a polarity opposite to that of the first conductive layer may be formed on the second semiconductor layer 130, wherein the semiconductor layer is formed in an N type semiconductor layer. The first semiconductor layer 110 may include a P type semiconductor layer, and the second semiconductor layer 130 may include an N type semiconductor layer. The light emitting structure layer 135 may include at least one of an N-P junction structure, a P-N junction structure, an N-P-N junction structure, and a P-N-P junction structure.

The channel layer 140 may be formed under the light emitting structure layer 135. An inner portion of the channel layer 140 may be provided at an outer peripheral portion of a lower portion of the light emitting structure layer 135, and an outer portion of the channel layer 140 may extend beyond a lateral surface of the light emitting structure layer 135.

The channel layer 140 may be formed in a strip shape, a ring shape or a frame shape having a polygonal shape or a circular shape under the second semiconductor layer 130.

The channel layer 140 may include a transmissive insulating layer or a transmissive conductive layer. For example, the channel layer 140 may include at least one selected from the group consisting of $SiO_2$, $SiO_x$, $SiO_xN_y$, $Si_3N_4$, $Al_2O_3$, $TiO_2$, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IrOx, RuOx, RuOx/ITO, Ni/IrOx/Au, and Ni/IrOx/Au/ITO.

The channel layer 140 may include a material transmitting a laser beam or a material, which is rarely fragmented by a laser beam, as well as the above materials. In addition, the channel layer 140 may improve the bonding strength with the second semiconductor layer 130. The width or the thickness of the channel layer 140 may be 2 μm or less.

An outer region 105 of the light emitting structure layer 135 may have a step structure with respect to the conductive support member 160. At least one lateral surface of the light emitting structure layer 135 may be formed perpendicularly to a lower surface of the light emitting structure layer 135 or may be inclined with respect to the lower surface of the light emitting structure layer 135.

The channel layer 140 spaces the electrode layer 150 from the second semiconductor layer 130 at a predetermined distance.

The channel layer 140 transmits a laser beam irradiated in the manufacturing process to prevent delamination from occurring at a lateral surface of the light emitting structure layer 135. The channel layer 140 can prevent metallic fragments derived from the electrode layer 150 or the conductive support member 160 from being introduced into outer portions of the first semiconductor layer 110, the active layer 120, and the second semiconductor layer 130. The channel layer 140 can delay the permeation of moisture into the outer portions of the first semiconductor layer 110, the active layer 120, and the second semiconductor layer 130.

The electrode layer 150 may include at least one conductive layer. The at least one conductive layer may include at least one of an ohmic layer, a reflective layer under the ohmic layer, and a bonding layer under the reflective layer. The ohmic layer may make ohmic contact with the lower surface of the lowermost layer of the light emitting structure layer, for example, the second semiconductor layer 130, and may have the form of a layer or a pattern. The ohmic layer may include at least one selected from the group consisting of ITO, IZO, IZTO, IAZO, IGZO, IGTO, AZO, ATO, GZO, IrOx, RuOx, RuOx/ITO, Ni/IrOx/Au, and Ni/IrOx/Au/ITO.

A reflective layer may be provided under the light emitting structure layer 135 and/or the ohmic layer. For instance, the reflective layer may be selected from the group consisting of Ag, Ni, Al, Rh, Pd, Ir, Ru, Mg, Zn, Pt, Au, Hf and the selective combination thereof.

The bonding layer may include barrier metal or bonding metal. For instance, the bonding layer may include at least one selected from the group consisting of Ti, Au, Sn, Ni, Cr, Ga, In, Bi, Cu, Ag and Ta.

The conductive support member 160 may be formed under the electrode layer 150. The conductive support member 160 may act as a base substrate and include metal such as Cu, the alloy of Cu, Au, the alloy of Au, Ni, the alloy of Ni, Mo, the alloy of Mo, or Cu—W. The conductive support substrate 160 may be formed through an electroplating scheme, a wafer bonding scheme, or a sputtering scheme. According to another embodiment, the conductive support member 160 may be bonded through metal plating. The thickness of the conductive support member 160 may have in the range of about 10 µm to about 500 µm.

One protrusion may project from at least one edge of the conductive support member 160. The protrusion may project in a thickness direction of the light emitting structure layer 135 and/or in the direction opposite to the thickness direction. The protrusion may include at least one or the mixture of materials constituting the electrode layer 150 and the conductive support member 160. A protrusion projecting from an upper edge of the conductive support member 160 is the first protrusion 201, and a protrusion projecting from a lower edge of the conductive support member 160 is the second protrusion 203.

The first protrusion 201 and the second protrusion 203 may burrs protruding from the conductive support member 160.

The first protrusion 201 may project from at least a portion of at least one upper edge of the conductive support member 160 toward the outside of the light emitting structure layer 135. The first protrusion 201 may have a height T1 corresponding to a distance of less than 10 µm from the upper edge of the conductive support member 160. In detail, the first protrusion 201 may be lower than an upper end of the light emitting structure layer 135 or may protrude at a height of 7 µm or less. The first protrusion 201 may have a height higher than the height of the active layer 120 of the light emitting structure layer 135.

The first protrusion 201 may be spaced apart from the lateral surface of the light emitting structure layer 135 at a distance of 1 µm or more. The first protrusion 201 may randomly protect from the upper edge of the conductive support member 160.

The first protrusion 201 may include be selected from the group consisting of Ag, Ni, Al, Rh, Pd, Ir, Ru, Mg, Zn, Pt, Au, Hf, Cu, Mo, and Cu—W.

The second protrusion 203 may project from at least a portion of at least one lower edge of the conductive support member 160 in a direction opposite to the protruding direction of the first protrusion 201. The second protrusion 203 may have a height T2 corresponding to a distance of 10 µm or less from the lower edge of the conductive support member 160. The heights T1 and T2 of the first and second protrusions 201 and 203 may be identical to each other or different from each other.

The first protrusion 201 may include at least one selected from the group consisting of Ag, Ni, Al, Rh, Pd, Ir, Ru, Mg, Zn, Pt, Au, Hf, Cu, Mo, Cu—W, and the selective combination thereof.

The first and second protrusions 201 and 203 may project from at least a portion of the upper edge and/or the lower edge of the conductive support member 160.

A concave part 168 is formed at a lateral surface of the conductive support member 160. The concave part 168 may be recessed inward or toward opposite from at least one lateral surface of the conductive support member 160.

The concave part 168 may be formed between the upper and lower edges of the conductive support member 160. For example, the concave part 160 may be recessed in a region between the first and second protrusions 201 and 203.

The depth of the concave part 168 may be gradually increased from the corner to the central portion of the lateral surface of the conductive support member 160.

The edge of the conductive support member 160 has at least one of the first and second protrusions 201 and 203, and the concave part 168 may be formed in the lateral surface of the conductive support member 160 from which the first protrusion 201 and/or the second protrusion 203 project.

A first protrusion 201 of the conductive support member 160 can be improved the light extraction efficiency of the light emitting device.

FIGS. 2 to 12 are sectional view showing the manufacturing process of the light emitting device 100 of FIG. 1.

Figure 2:
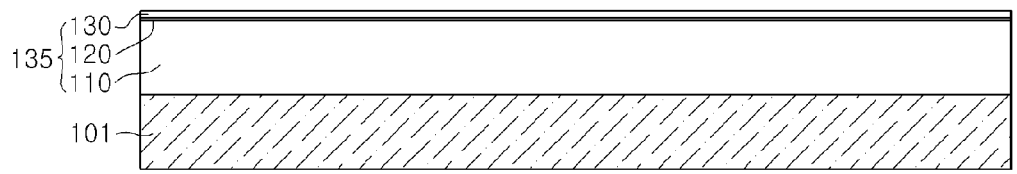
FIGS. 2 to 12 are sectional views showing the manufacturing process of the light emitting device of FIG. 1.
Figure 3:
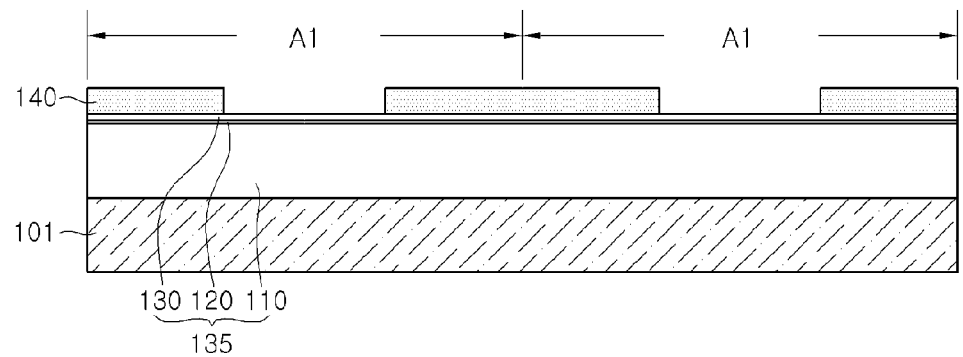

Referring to FIGS. 2 and 3, a substrate 101 is loaded into growth equipment, and a compound semiconductor layer of group II to VI elements is formed on the substrate 101.

The growth equipment may be selected from the group consisting of E-beam evaporator, PVD (physical vapor deposition), CVD (chemical vapor deposition), PLD (plasma laser deposition), dual-type thermal evaporator, sputtering, and MOCVD (metal organic chemical vapor deposition). However, the embodiment is not limited to the above growth equipment.

The substrate 101 may be selected from the group consisting of a sapphire substrate including $Al_2O_3$, a substrate including GaN, SiC, ZnO, Si, GaP, InP, or $Ga_2O_3$, a conductive substrate, and a substrate including GaAs. A concavo-convex pattern may be formed on a top surface of the substrate 101. In addition, the substrate 101 may be provided thereon with a layer or pattern including a compound semiconductor of group II to VI elements, for example, at least one of a ZnO layer, a nitride buffer layer, and an undoped semiconductor layer.

The buffer layer and the undoped semiconductor layer may be formed by using a compound semiconductor of group III-V elements. The buffer layer can reduce a lattice constant mismatch with respect to the substrate 101. The undoped semiconductor layer may include a GaN-based semiconductor that is not doped with dopants to improve the crystalline of a semiconductor layer.

The substrate 101 is formed thereon with the light emitting structure layer 135 including a plurality of compound semiconductor layers. The light emitting structure layer 135 includes the first semiconductor layer 110, the active layer 120 on the first semiconductor layer 110, and the second semiconductor layer 130 on the active layer 120.

The first semiconductor layer 110 may include an N type semiconductor, and the second semiconductor layer 130 may include a P type semiconductor layer.

The first and second semiconductor layers 110 and 130 may include compound semiconductors of group III-V elements, for instance, semiconductor materials having a compositional formula of $In_xAl_yGa_{1-x-y}N$ ($0 \leq x \leq 1$, $0 \leq y \leq 1$, and $0 \leq x+y \leq 1$). The first and second semiconductor layers 110 and 130 may be selected from the group consisting of, GaN, AlN, AlGaN, InGaN, InN, InAlGaN, AlInN, AlGaAs, GaP, GaAs, GaAsP, and AlGaInP. The first and second semiconductor layers 110 and 130 may have a single layer structure or a multi-layer structure, but the embodiment is not limited thereto.

The active layer 120 may include at least one of a single quantum well structure, a multiple quantum well structure, a quantum wire structure and a quantum dot structure. The active layer 120 may have a stack structure including well and barrier layers which are made of a compound semiconductor of group III-V elements. For instance, the active layer 120 may have a stack structure of InGaN well/GaN barrier layers, InGaN well/AlGaN barrier layers, or InGaN well/InGaN barrier layers.

The conductive clad layer may be formed on and/or under the active layer 120. The conductive clad layer may include a GaN-based semiconductor. The bandgap of the conductive clad layer may be higher than the bandgap of the barrier layer.

A third semiconductor layer, for instance, an N type semiconductor layer may be further formed on the second semiconductor layer 130, but the embodiment is not limited thereto. Therefore, the light emitting structure layer 135 may include at least one of an N-P junction structure, a P-N junction structure, an N-P-N junction structure, and a P-N-P junction structure.

Figure 4:
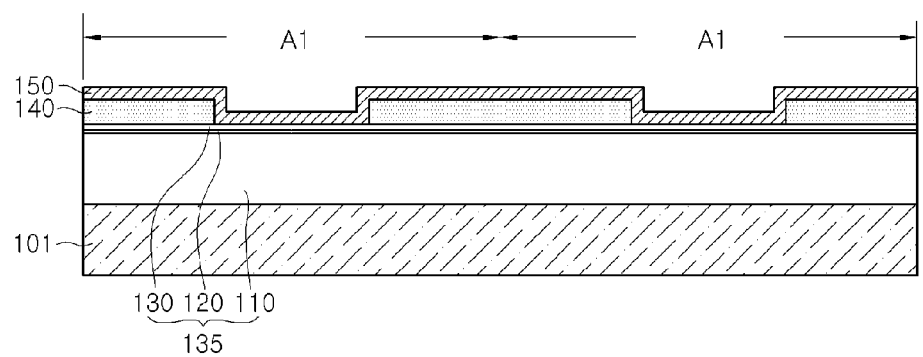

Referring to FIGS. 3 and 4, the channel layer 140 is formed on the second semiconductor layer 130. After forming a mask pattern on a first region of the second semiconductor layer 130, the channel layer 140 is formed around the first region, and the mask pattern is removed. The first region may be the center of each chip region Al, but the embodiment is not limited thereto.

The channel layer 140 may be formed at an outer peripheral portion of the first region of the second semiconductor layer 130, and may have a loop shape, a ring shape, and a frame shape having a circular shape or a polygonal shape. The channel layer 140 may have a continuous loop shape or a discrete loop shape.

The channel layer 140 includes a transmissive layer, for example, an insulating layer or a conductive layer. The channel layer 140 may include at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, IrOx, RuOx, RuOx/ITO, Ni/IrOx/Au, and Ni/IrOx/Au/ITO. The channel layer 140 may include a material transmitting a laser beam or a material, which is rarely fragmented by a laser beam, as well as the above materials, but the embodiment is not limited thereto. The width or the thickness of the channel layer 140 may be 2 μm or less.

In addition, the channel layer 140 may include a material providing superior bonding strength with respect to the second semiconductor layer 130. Another metallic layer may be further formed on and/or under the channel layer 140, but the embodiment is not limited thereto.

Figure 5:
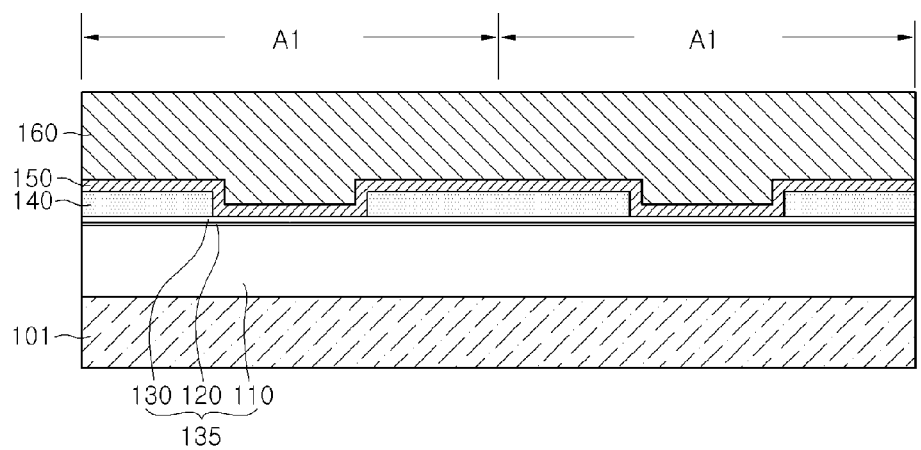

Referring to FIGS. 4 and 5, the electrode layer 150 is formed on the second semiconductor layer 130. The electrode layer 150 may be formed in the first region of the second semiconductor layer 130. The electrode layer 150 may extend from the top surface of the second semiconductor layer 130 to the top surface of the channel layer 140.

The electrode layer 150 may include a plurality of conductive layers. At least one of the conductive layers may have a width different from those of remaining conductive layers. In addition, at least one conductive layer may have a different electrical characteristic or a different reflective characteristic.

The conductive layers may include at least one of the ohmic layer, the reflective layer under the ohmic layer, and the bonding layer under the reflective layer. The ohmic layer may make ohmic contact with the uppermost layer of the light emitting structure layer, for example, the top surface of the second semiconductor layer 130, and may have the form of a layer or a pattern. The ohmic layer may include at least one selected from the group consisting of ITO, IZO, IZTO, IAZO, IGZO, IGTO, AZO, ATO, GZO, IrOx, RuOx, RuOx/ITO, Ni/IrOx/Au, and Ni/IrOx/Au/ITO.

A reflective layer may be provided under the light emitting structure layer 135 and/or the ohmic layer. For instance, the reflective layer may be selected from the group consisting of Ag, Ni, Al, Rh, Pd, Ir, Ru, Mg, Zn, Pt, Au, Hf and the selective combination thereof.

The bonding layer may include barrier metal or bonding metal. For instance, the bonding layer may include at least one selected from the group consisting of Ti, Au, Sn, Ni, Cr, Ga, In, Bi, Cu, Ag and Ta.

Figure 6:
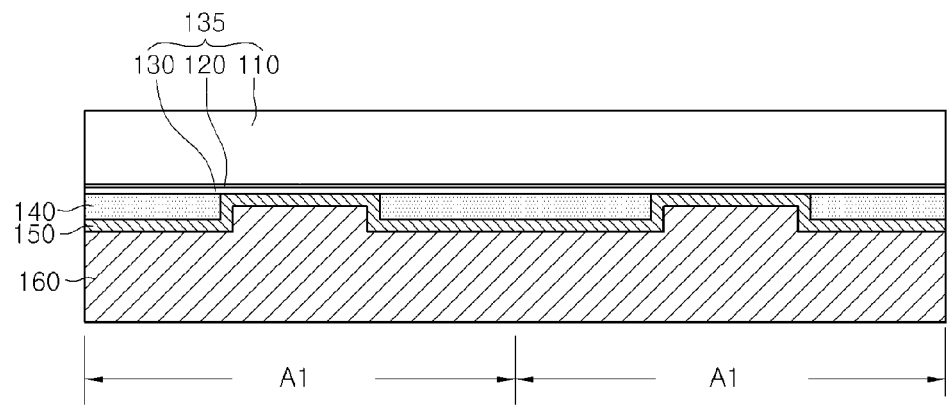

Referring to FIGS. 5 and 6, the conductive support member 160 may be formed on the electrode layer 150. The conductive support member 160 may act as a base substrate and include metal such as Cu, the alloy of Cu, Au, the alloy of Au, Ni, the alloy of Ni, Mo, the alloy of Mo, or Cu—W. The conductive support substrate 160 may be formed through an electroplating scheme, but the embodiment is not limited thereto. The thickness of the conductive support member 160 may have in the range of about 10 μm to about 500 μm, but the embodiment is not limited thereto.

The conductive support member 160 supports the light emitting structure layer 135 so that the light emitting structure layer 135 can be prevented from being bent or damaged due to an LLO (Laser Lift Off) process to be described later.

The conductive support member 160 is prepared as a base, and the substrate 101 is removed. The substrate 101 may be removed physically and/or chemically. In order to physically remove the substrate 101, a laser beam having a predetermined wavelength band is irradiated into the substrate 101 such that the substrate 101 can be removed. In order to chemically remove the substrate 101, after forming a hole, the semiconductor layer is removed between the substrate 101 and the light emitting structure layer 135 through an etching process, such that the substrate 101 can be removed. The surface of the first semiconductor layer 110 may be subject to ICP/RIE (Inductively coupled Plasma/Reactive Ion Etching).

Figure 7:
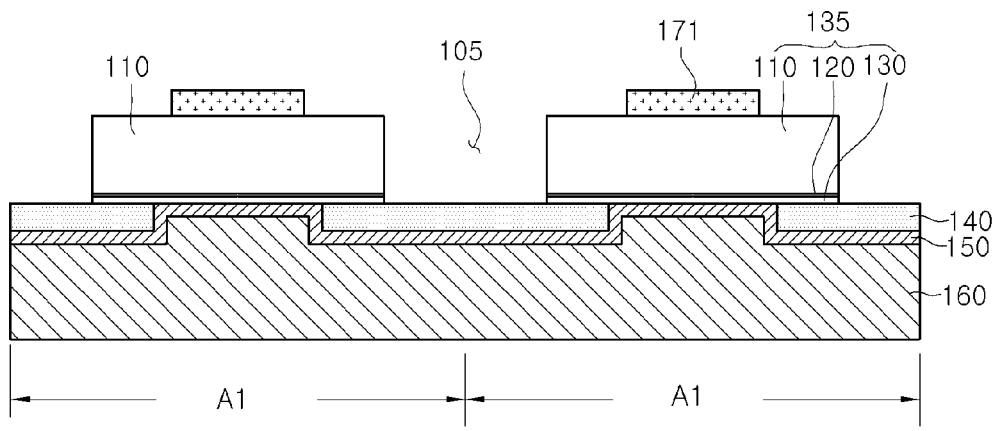

Referring to FIGS. 6 and 7, the light emitting structure layer 135 is etched. The etching process may include an isolation etching process according to the width of an individual chip. In other words, the etching process may include a dry and/or wet etching process. The etching process is performed with respect to the outer peripheral portion of the light emitting structure layer 135 such that the channel layer 140 can be exposed to the outer region 105.

The outer region 105 is a channel region between chips or a region in which the light emitting structure layer 135 can be removed. In this case, the gap between light emitting structure layers 135 is a gap between chips. The gap may be 5 μm or more.

The first electrode 171 is electrically connected to the first semiconductor layer 110. For example, the first electrode 171 may be provided on the first semiconductor layer 110. The first electrode 171 may include a pad or a structure including a pattern connected to the pad. The first electrode 171 may be performed after or before another process or the following process is performed, but the embodiment is not limited thereto.

A concavo-convex pattern or a roughness may be further formed on the surface of the first semiconductor layer 110, and this structure can improve a light emitting efficiency. The outer lateral surface of the light emitting structure layer 135 may be perpendicular to the lower surface of the light emitting structure layer 135 or may be inclined with respect to the lower surface of the light emitting structure layer 135, but the embodiment is not limited thereto.

Figure 8:
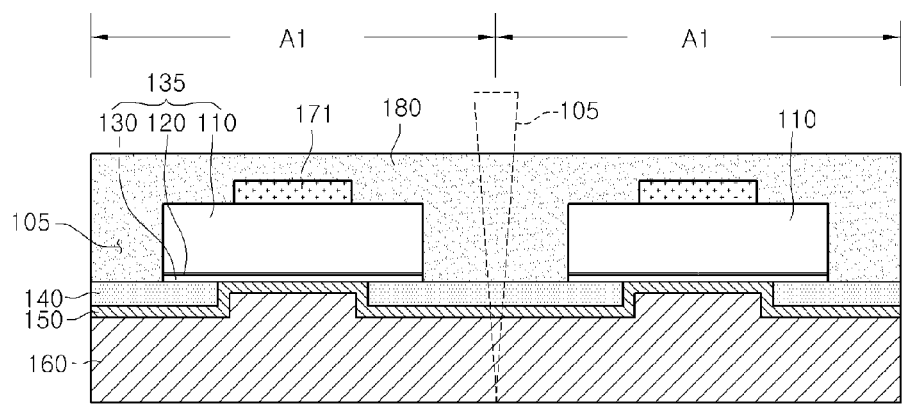
Figure 9:
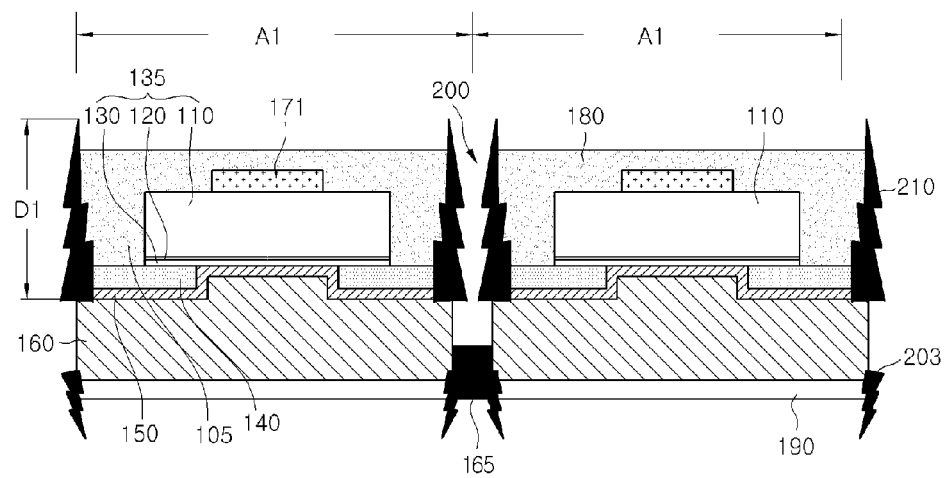

Referring to FIGS. 8 and 9, a protective layer 180 is formed on the light emitting structure layer 135. The protective layer 180 can prevent the chip from being damaged in a laser process. For example, the protective layer 180 may include PR (photoresist), but the embodiment is not limited thereto.

A support layer 190 is formed under the conductive support member 160. For example, the support layer 190 may include an adhesive sheet having a predetermined thickness. The support layer 190 supports the chip when the laser process is performed. For example, the adhesive sheet may be a UV sheet or a blue sheet, but the embodiment is not limited thereto. At least one of the protective layer 180 and the support layer 190 may be omitted or added if necessity. For example, another protective layer may be further interposed between the conductive support member 160 and the support layer 190.

A laser scribing process is performed by a laser to allow a laser beam 195 to be concentrated onto a predetermined point of the conductive support member 160.

Figure 10:
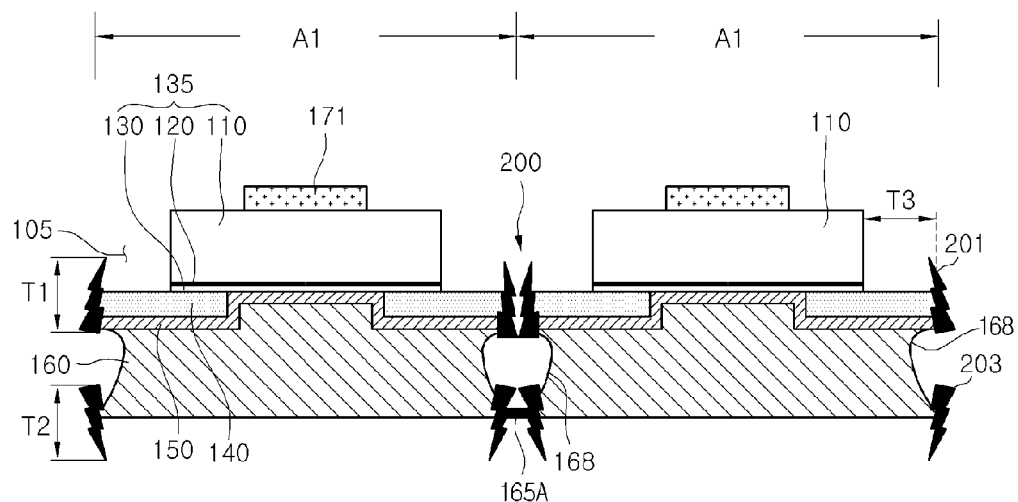

Referring to FIGS. 9 and 10, boundary regions 200 between chip regions A1 are spaced apart from each other through the laser scribing process. In other words, the boundary regions 200 are spaced apart from each other such that the chip regions A1 are distinguished from each other.

In this case, the boundary region 200 may not separate the chip regions A1 from each other completely. Since the conductive support member 160 may include a material, such as Cu, Au, Mo, or Ni, having great flexibility, the boundary regions 200 may be spaced apart from each other through the laser process, but the boundary regions 200 may be re-combined with each other when the boundary regions 200 are hardened or fused. In other words, a re-combination part 165 may be formed due to the recombination of the boundary regions 200.

The re-combination part 165 is formed by bonding edges of the conductive support members 160 formed in the unit of a chip to each other, that is, by bonding regions of the conductive support members 160 into which a laser beam is irradiated to each other. The whole thickness of the re-combination part 165 may be increased as the thickness of the conductive support member 160 is increased. The protective layer 180 and/or the support layer 190 may be removed after the laser scribing process has been performed. The re-combination part 165 may not be formed, but the embodiment is not limited thereto.

Protrusions 201 and 203 may be formed at the boundary region 200 through the laser scribing process. For example, at least one of the protrusions 201 and 203 may protrude from at least one edge of the conductive support member 160. The protrusions 201 and 203 may protrude in a thickness direction of the light emitting structure layer 135 and/or an opposite direction of the thickness direction of the light emitting structure layer 135. The protrusions 201 and 203 may include at least one of materials constituting the electrode layer 150 and the conductive support member 160 or the mixture of the materials. The first protrusion 201 is formed at the upper edge of the conductive support member 160, and the second protrusion 203 is formed at the lower edge of the conductive support member 160. The first and second protrusions 201 and 203 may be burrs projecting from the conductive support member 160.

The first protrusion 201 may project from at least one portion of at least the upper edge of the conductive support member 160, and may project outward (e.g., upward) from the light emitting structure layer 135.

The first protrusion 201 may protrude from the upper edge of the conductive support member 160 in the thickness direction of the light emitting structure layer 135 by a predetermined height T0.

The height T0 of the first protrusion 201 may vary according to the laser power. For example, the first protrusion 201 may project from the upper edge of the conductive support member 160 by a height of about 10 μm to about 30 μm. The first protrusion 201 having the height T0 partially surrounds an outer peripheral portion of the light emitting structure layer 135 or fully surrounds the whole region of light emitting structure layer 135, so that light emitting efficiency may be degraded.

In this case, first protrusions 201 are arranged outside the light emitting structure layer 135 such that the first protrusions 201 are spaced apart from each other. The first protrusions 201 may be distanced from the light emitting structure layer 135 by 1 nm or more.

The second protrusion 203 may be formed at least a portion of at least one lower edge of the conductive support member 160, and may project in an opposite direction (e.g., downward) of the first protrusion 201. The height of the second protrusion 203 may be lower than that of the first protrusion 201. In detail, since a laser beam is irradiated from an upper portion of a chip to a lower portion of the chip, the energy of light is less concentrated in an exit region of the light than in an incident region of the light. Accordingly, the height of the second protrusion 203 is lower than that of the first protrusion 201.

Figure 11:
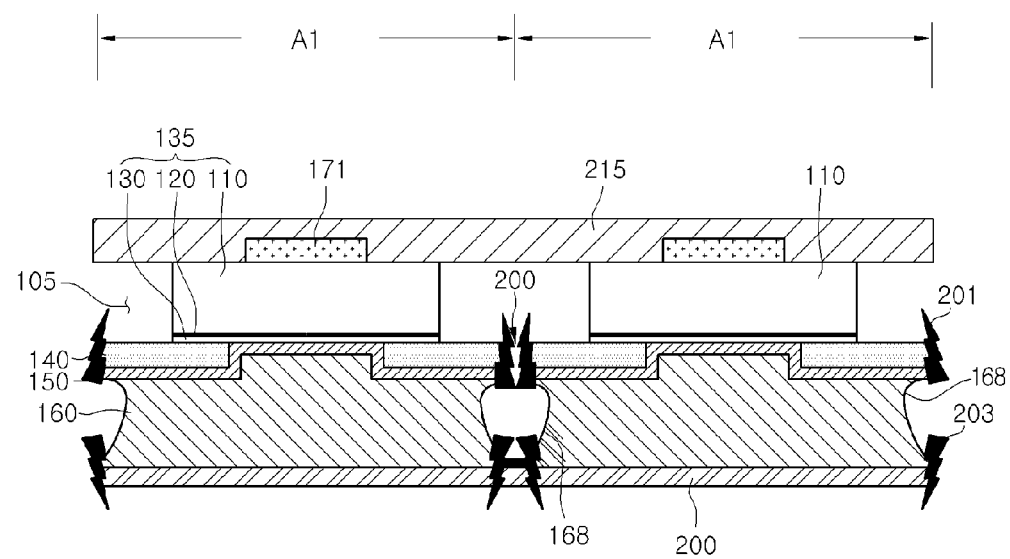

Referring to FIGS. 10 and 11, a wet etching process is performed with respect to the boundary region 200 between the chip regions A1. Through the wet etching process, a re-combination part 165A is partially etched. In addition, the size of at least one of the first and second protrusions 201 and 203 may be reduced through the wet etching process.

The first and second protrusions 201 and 203 may be partially formed in at least a portion of the upper and lower edges of the conductive support member 160.

The first protrusion 201 may have the height T1 corresponding to a distance of less than 10 μm from the upper edge of the conductive support member 160 through the wet etching process. In detail, the first protrusion 201 may be lower than an upper end of the light emitting structure layer 135 or may protrude at a height of 7 μm or less. The first protrusion 201 may have the height T1 higher than the height of the active layer 120 of the light emitting structure layer 135 or the top surface of the channel layer 140.

The first protrusion 201 may be spaced apart from the light emitting structure layer 135 at a distance T3 of about 1 μm or more.

The second protrusion 203 projects from the lower edge of the conductive support member 160 in an opposite direction of the first protrusion 201. In detail, the second protrusion 203 may project with the height T2 of about 10 μm or less from the lower edge of the conductive support member 160.

In this case, the first and second protrusions 201 and 203 may be formed in at least a portion of at least one edge or all edges of the conductive support member 160, and may abnormally project from the conductive support member 160.

The concave part 163 may be recessed inward from the lateral surface of the conductive support member 160. The concave part 163 may be formed through the etching process. The etching process may selectively include a wet etching process performed by using a chemical solution as an etchant and/or a dry etching process performed by using gas as an etchant.

FIG. 10 is a sectional view showing the light emitting device 100 when the wet etching process is performed. When the wet etching process is performed, the concave part 168 of the boundary region 200 may be recessed with a curved surface inward from at least a portion of at least one lateral surface of the conductive support member 160. The wet etching process is an isotropic etching process which is a non-directional etching process, and the size of the concave part 168 in FIG. 10 may be exaggerated for the purpose of explanation.

The concave part 168 may be provided in adjacent to the first and second protrusions 201 and 203, but the embodiment is not limited thereto.

In this case, the concave part 168 is more deeply recessed as the contact area of the etchant is increased. For example, when the etching process is performed from the top surface of the conductive support member 160, an upper portion of the concave part 168 of the boundary region 200 is more deeply recessed than a lower portion of the concave part 168.

When the dry etching process is performed, an etching process having directionality is possible, so that a curved surface recessed inward may not be formed in the boundary region 200 differently from the wet etching process. However, the dry etching process may represent a lower etch rate.

The protective layer shown in FIG. 8 is removed. In addition, the support layer 190 under the conductive support member 160 may be removed or may remain in an attachment state to the next step.

Referring to FIG. 11, an upper cover sheet 215 is attached to an upper portion of a chip, and a lower cover sheet 210 is attached to a lower portion of the conductive support member 160.

The upper cover sheet 215 may have the form of a thin adhesion sheet, or may not be applied. The lower cover sheet 210 may be an adhesion sheet having an adhesion property. For example, the lower cover sheet 210 may include a UV sheet or a blue sheet, but the embodiment is not limited thereto.

The upper cover sheet 214 is formed on the light emitting structure layer 135 and the first electrode 171, thereby preventing the chip from being protected in a breaking process.

When the semiconductor light emitting device is divided in the unit of a chip in the breaking process, the lower cover sheet 210 fixes the divided chips of the semiconductor light emitting device such that the divided chips are not scattered, and sorts the chips.

Figure 12:
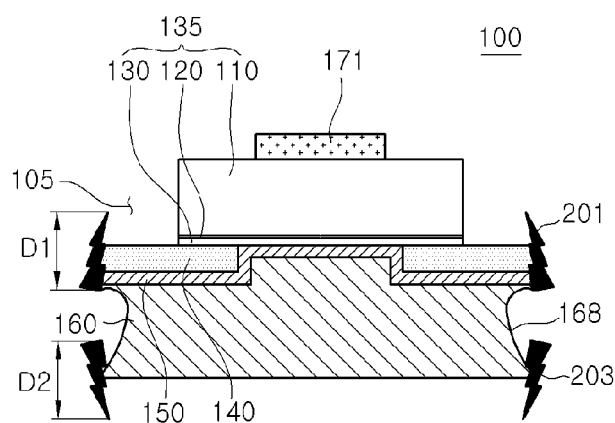

Referring to FIGS. 11 and 12, the breaking process is performed with respect to the boundary region 200 to form individual chips. As shown in FIGS. 11 and 12, the first chip is separated from the second chip through the breaking process.

According to the breaking process, the re-combination part 165 of the boundary region 200 is cut by using a cutter so that the first chip is completely separated from the second chip in the unit of a chip. Therefore, the light emitting device 100 which is an individual chip is manufactured.

According to the embodiment, the wet etching process is performed with respect to the chip boundary region 200 to lower the height of the first protrusion 201 protruding out of the chip or remove the first protrusion 201, so that light absorption by the first protrusion 201 provided outside the light emitting structure layer 135 can be reduced. Accordingly, the light extraction efficiency can be improved.

In addition, since at least a portion of the re-combination part 165 is removed, the whole thickness of the re-combination part 165 is reduced, so that failures caused by the breaking process can be reduced. Accordingly, the product yield in the manufacturing process of the light emitting device can be improved.

The upper and lower cover sheets 215 and 210 can be removed after the breaking process.

Figure 13:
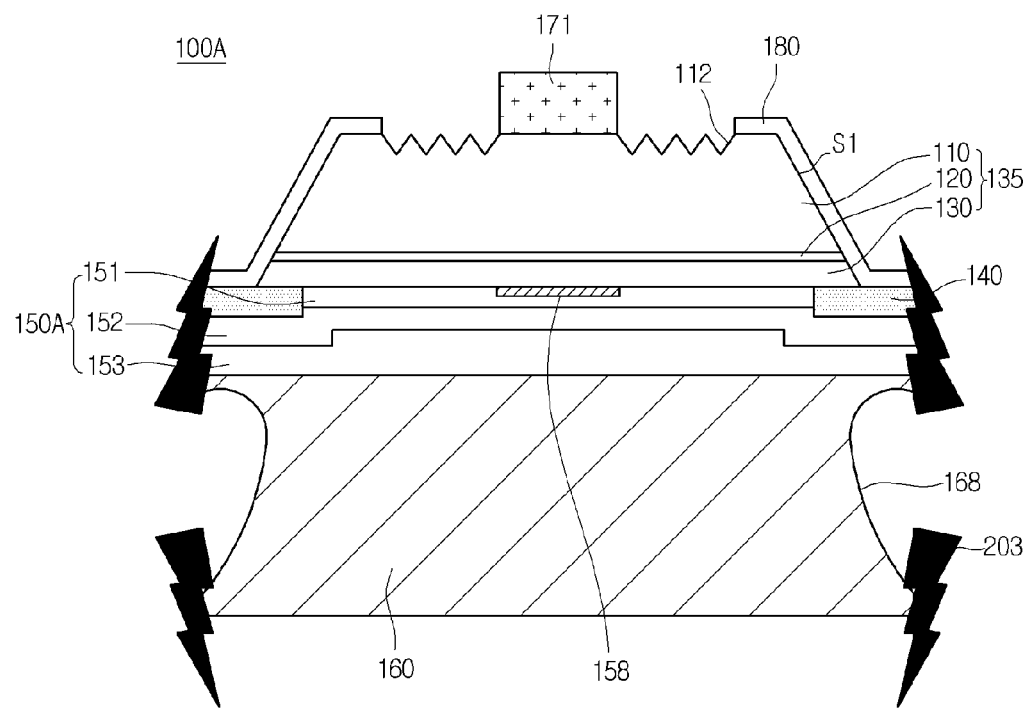
FIG. 13 is a sectional view showing a light emitting device according to a second embodiment.

FIG. 13 is a sectional view showing a light emitting device 100A according to the second embodiment.

Referring to FIG. 13, the light emitting device 100A includes the light emitting structure layer 135 including a plurality of compound semiconductor layers, a plurality of conductive layers 150A under the light emitting structure layer 135, the conductive support member 160 under the conductive layer 150A, the first electrode 171, and the channel layer 140 interposed between the light emitting structure layer 135 and at least one conductive layer 150A.

The light emitting structure layer 135 may include the LED including a compound semiconductor, for example, a compound semiconductor of group III-V elements. The LED may include a color LED having a visible ray wavelength band to emit blue, red, or green light or a UV LED, but the embodiment is not limited thereto.

The light emitting structure layer 135 includes the first semiconductor layer 110 including group III-V compound semiconductors, the active layer 120, and the second semiconductor layer 130. Other structures are the same as those of the first embodiment and will not be further described.

A light extracting structure 112 is foamed on the first semiconductor layer 110. The light extracting structure 112 may include a concavo-convex structure on a top surface of the first semiconductor layer 110 or include a separate roughness on the top surface of the first semiconductor layer 110. The light extracting structure 112 changes a critical angle of light directed to the top surface of the first semiconductor layer 110, so that the light extraction efficiency can be improved.

The first semiconductor layer 110 may have a super-lattice structure (SLS) in which two layers having different refractive indexes and different media are alternately arranged. For example, the super-lattice structure may have three to ten stack structures by using at least one pair of InGaN/GaN SLS, AlGaN/GaN SLS, InGaN/InGaN SLS, and AlGaN/InGaN SLS.

The first electrode 171 may be formed on the first semiconductor layer 110. The first electrode 171 may include a pad or an electrode having a branch or arm pattern connected to the pad, but the embodiment is not limited thereto.

A passivation layer 180 may be formed at the lateral surface of the light emitting structure layer 120, and may include an insulating material. The passivation layer 180 may extend the top surface of the first semiconductor layer 110 to the top surface of the channel layer 140. The insulating material may be selected from the group consisting of $SiO_2$, $SiO_x$, $SiO_xN_y$, $Si_3N_4$, $Al_2O_3$, and $TiO_2$.

The conductive layers 150A includes a first conductive layer 151 making ohmic contact with a lower portion of the second semiconductor layer 130, a second conductive layer 152 serving as a reflective layer under the first conductive layer 151, and a third conductive layer 153 formed under the second conductive layer 152 and used to bond with the conductive support member 160.

The first conductive layer 151 serves as an ohmic layer making ohmic contact with the lower surface of the second semiconductor layer 130, and may include at least one selected from the group consisting of metal, metal oxide, and metal nitride. The first conductive layer 151 may include at least one selected from the group consisting of ITO, IZO, IZON, IZTO, IAZO, IGZO, IGTO, AZO, ATO, GZO, IrOx, RuOx, RuOx/ITO, Ni/IrOx/Au, Ni/IrOx/Au/ITO, Ag, Pt, Ni, Au, Rh, and Pd. The first conductive layer 151 may have a single layer structure or a multi-layer structure by selectively using the above materials.

The second conductive layer 152 is formed under the first conductive layer 151 and serves as a reflective layer. The reflective layer may include metal having at least 50% of a reflective rate. The second conductive layer 152 may include at least one layer including one selected from the group consisting of Ag, Ni, Al, Rh, Pd, Ir, Ru, Mg, Zn, Pt, Au, Hf, and the alloy of at least two of the materials. The first and second conductive layers 151 and 152 serve as a second electrode, but the embodiment is not limited thereto.

A portion of the second conductive layer 152 is provided in the channel layer 140 to effectively reflect incident light. The second conductive layer 152 may extend to the lower surface of the channel layer 140. In detail, the second conductive layer 152 may extend over the whole area of the lower surface of the channel layer 140 or 80% of the lower surface of the channel layer 140.

The third conductive layer 153 is formed under the second conductive layer 152, and used as a barrier layer and/or bonding layer. The third conductive layer 153 may include at least one selected from the group consisting of Cu, Ni, Ag, Mo, Al, Au, Nb, W, Ti, Cr, Ta, Al, Pd, Pt, Si, Al—Si, Ag—Cd, Au—Sb, Al—Zn, Al—Mg, Al—Ge, Pd—Pb, Ag—Sb, Au—In, Al—Cu—Si, Ag—Cd—Cu, Cu—Sb, Cd—Cu, Al—Si—Cu, Ag—Cu, Ag—Zn, Ag—Cu—Zn, Ag—Cd—Cu—Zn, Au—Si, Au—Ge, Au—Ni, Au—Cu, Au—Ag—Cu, Cu—Cu2O, Cu—Zn, Cu—P, Ni—B, Ni—Mn—Pd, Ni—P, and Pd—Ni, or the alloy of one of the materials. The third conductive layer 153 may have a single layer structure or a multi-layer structure.

The third conductive layer 153 serves as a bonding layer to bond the conductive support member 160 to the second conductive layer 153. The third conductive layer 153 may extend to the lateral surface of the second conductive layer 152, but the embodiment is not limited thereto.

The conductive support member 160 is formed under the third conductive layer 153, and may include a material selected from materials disclosed in the first embodiment. The conductive support member 160 supports the light emitting structure layer 135. The thickness of the conductive support member 160 may be in the range of about 30 μm to about 500 μm, but the embodiment is not limited thereto.

The inner portion of the channel layer 140 is formed at an outer peripheral portion of the lower surface of the light emitting structure layer 135, and the outer portion of the channel layer 140 may further extend beyond the lateral surface of the light emitting structure layer 135. The channel layer 140 is provided between the second conductive layer 152 and the light emitting structure layer 135 to separate a conductive material from a semiconductor layer. The inner portion of the channel layer 140 may overlap with the light emitting structure layer 135 by a predetermined width (e.g., a few of μm to a few tens of μm). The thickness of the channel layer 140 may be in the range of about 0.02 μm to about 5 μm, and may vary according to a chip size.

The channel layer 140 may have a loop shape, a ring shape, or a frame shape. The channel layer 140 may have a continuous pattern or a discrete pattern.

The channel layer 140 may be selected from the group consisting of metal oxide, metal nitride, and an insulating material having a refractive index lower than that of group III-V compound semiconductors. The channel layer 140 may be selected from the group consisting of ITO, IZO, IZTO, IZON, IAZO, IGZO, IGTO, AZO, ATO, GZO, $SiO_2$, $SiO_x$, $SiO_xN_y$, $Si_3N_4$, $Al_2O_3$, and $TiO_2$.

The channel layer 140 may space the outer portions of the layers of the light emitting structure layer 135 from the third conductive layer 153.

A current blocking layer 158 may be formed under the light emitting structure layer 135. The current blocking layer 158 vertically overlaps with the first electrode 171. The current blocking layer 158 may have electrical conductivity lower than that of the first conductive layer 151. For example, the current blocking layer 158 may be selected from the group consisting of $SiO_2$, $SiO_x$, $SiO_xN_y$, $Si_3N_4$, $Al_2O_3$, and $TiO_2$ or include metallic material making schottky contact with the first conductive layer 151.

At least one protrusion may project from at least one edge of the conductive support member 160. The protrusion may project in a thickness direction of the light emitting structure layer 135 and/or an opposite direction to the thickness direction. The protrusion may include at least one or the mixture of materials constituting the second and third conductive layers 152 and 153 and the conductive support member 160. The first protrusion 201 is formed at an upper edge of the conductive support member 160, and the second protrusion 203 is formed at the lower edge of the conductive support member 160. The first and second protrusions 201 and 203 may be burs projecting from the conductive support member 160.

The first protrusion 201 may protrude from at least one of at least one upper edge of the conductive support member 160, and may protrude toward the outer portion of the light emitting structure layer 135. The upper end of the first protrusion 201 may project with a height of less than 10 μm from the upper edge of the conductive support member 160. In detail, the first protrusion 201 may be lower than the upper end of the light emitting structure layer 135 or may protrude at a height of 7 μm or less. The first protrusion 201 may have a height higher than the height of the active layer 120 of the light emitting structure layer 135.

The first protrusion 201 is spaced apart from the lateral surface of the light emitting structure layer 135 at a distance of 1 μm or more. The first protrusion 201 may randomly protrude from the upper edge of the conductive support member 160.

The first protrusion 201 may be selected from the group consisting of Ag, Ni, Al, Rh, Pd, Ir, Ru, Mg, Zn, Pt, Au, Hf, Cu, Mo, and Cu—W.

The second protrusion 203 projects from at least a portion of at least one lower edge of the conductive support member 160, and may project in an opposite direction to the protruding direction of the first protrusion 201. The second protrusion 203 may project from the lower edge of the conductive support member 160 by a height of 10 μm or less. The heights T1 and T2 of the first and second protrusions 201 and 203 may be identical to each other or different from each other.

The second protrusion 203 may include at least one selected from the group consisting of Ag, Ni, Al, Rh, Pd, Ir, Ru, Mg, Zn, Pt, Au, Hf, Cu, Mo, and Cu—W or the selective combination thereof.

The first and second protrusions 201 and 203 may project from at least one of the upper and/or lower edges of the conductive support member 160.

The concave part 168 is formed at the lateral surface of the conductive support member 160. The concave part 168 is recessed inward or toward opposite from at least one lateral surface of the conductive support member 160.

The concave part 168 may be formed between the upper and lower edges of the conductive support member 160. For example, the concave part 160 may be recessed in a region between the first and second protrusions 201 and 203.

The depth of the concave part 168 may be gradually increased from the corner to the central portion of the lateral surface of the conductive support member 160.

The edge of the conductive support member 160 has at least one of the first and second protrusions 201 and 203, and the concave part 168 may be formed in the lateral surface of the conductive support member 160 from which the first protrusion 201 and/or the second protrusion 203 project.

Figure 14:
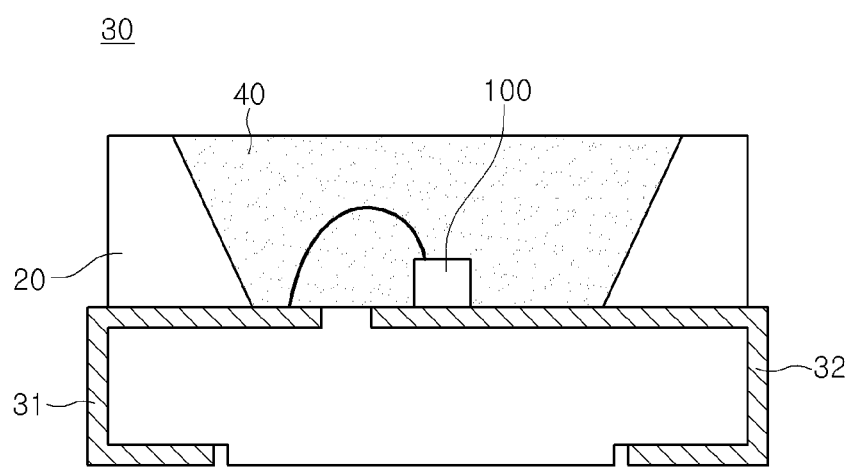
FIG. 14 is a sectional view showing a light emitting device package having the light emitting device of FIG. 1.

FIG. 14 is a sectional view showing a light emitting device package 30 having the light emitting device 100 of FIG. 1.

Referring to FIG. 14, the light emitting device package 30 includes a body 20, first and second lead electrodes 31 and 32 formed on the body 20, the light emitting device 100 shown in FIG. 1 provided on the body 20 and electrically connected to the first and second lead electrodes 31 and 32 and a molding member 40 that surrounds the light emitting device 100.

The body 20 may include silicon, synthetic resin or metallic material. When viewed from the top, the body 20 has a cavity having an open upper portion and formed with an inclined inner wall around the light emitting device 100.

The first and second electrode layers 31 and 32 are formed in a lead frame or metal layer using a metallic material. The first and second electrode layers 31 and 32 are electrically isolated from each other and supply power to the light emitting device 100. The first and second lead electrodes 31 and 32 can reflect light generated from the light emitting device 100 to increase light efficiency and dissipate heat emitted from the light emitting device 100 to the outside.

The light emitting device 100 can be installed on the body 20 or the first and second lead electrodes 31 and 32.

The light emitting device 100 may be electrically connected to the first lead electrode 31 through a wire, and may be connected to the second lead electrode 32 through a die bonding scheme.

The molding member 40 surrounds the light emitting device 100 to protect the light emitting device 100. In addition, the molding member 40 may include phosphors to change the wavelength of the light emitted from the light emitting device 100.

In this case, the first protrusion 201 projecting from the edge of the light emitting device 100 of FIG. 1 is coupled with the molding member 40 to prevent the molding member 40 from moving or being delaminated. The second protrusion 203 improves the bonding strength with a solder when solder bonding is performed.

A lens may be directly mounted on the molding member 40 or mounted on the molding member at a predetermined distance, but the embodiment is not limited thereto.

Although the embodiment has been described in that the light emitting device package has a top view type, the light emitting device package may have a side view type. Accordingly, a heat sink characteristic, conductivity, and a reflectance characteristic can be improved. After such a top-view-type or side-view-type light emitting device is packaged by the molding member, a lens may be formed on the molding member or the lens may be bonded with the molding member, but the embodiment is not limited thereto.

<Lighting System>

The light emitting device or the light emitting device package according to the embodiment can be applied to the light unit. The light unit includes a plurality of light emitting devices or a plurality of light emitting device packages which are arrayed in the light unit. The light unit may include a lighting lamp, a signal lamp, a headlight of a vehicle, and an electric signboard.

Figure 15:
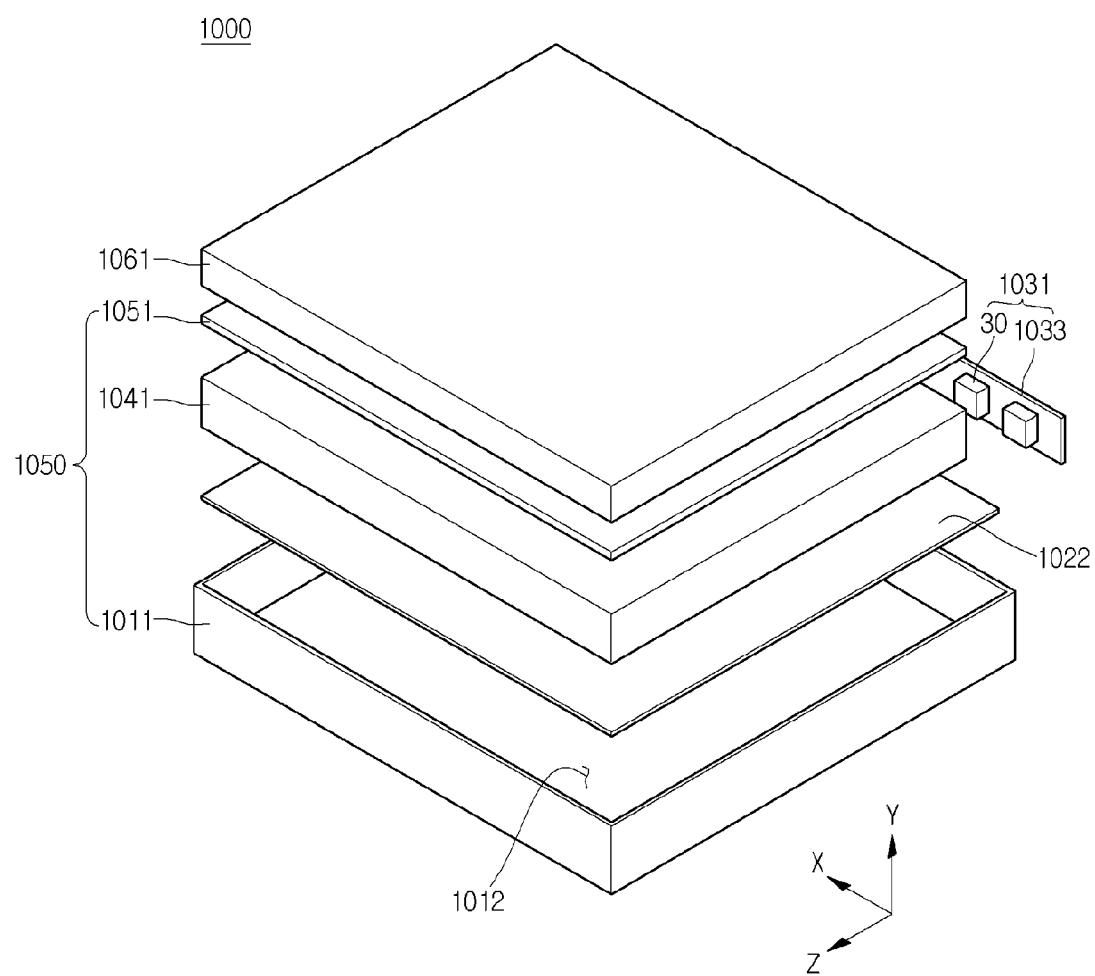
FIG. 15 is a diagram illustrating a display device according to an embodiment.
Figure 16:
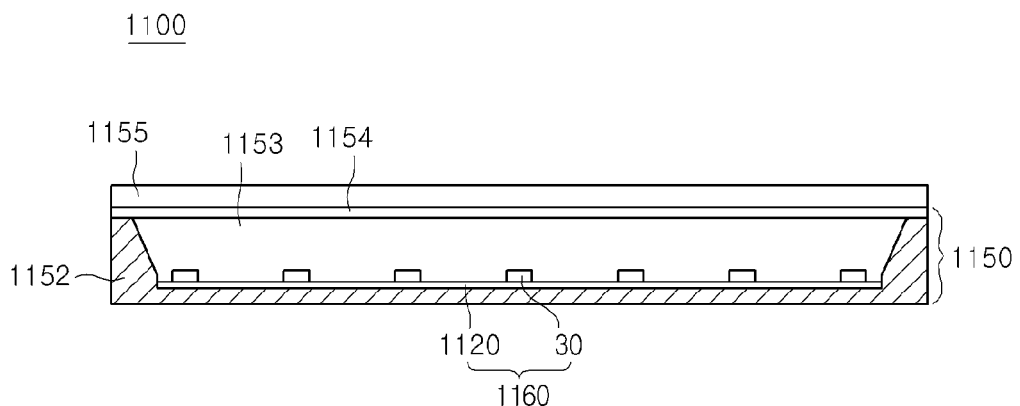
FIG. 16 is a diagram illustrating another display device according to an embodiment.
Figure 17:
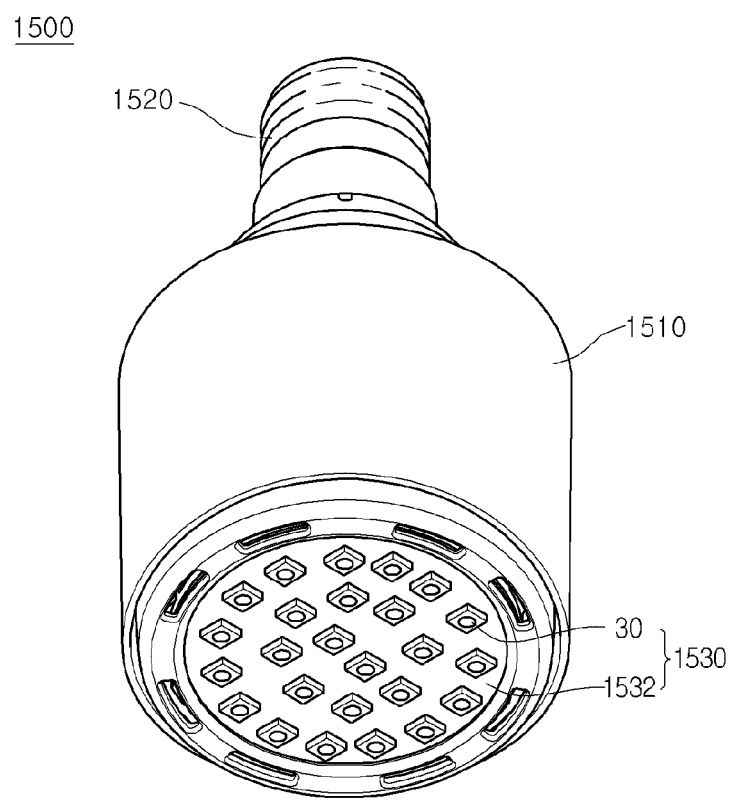
FIG. 17 is a diagram illustrating an illumination device according to an embodiment.

The illumination system may include display devices illustrated in FIGS. 15 and 16, an illumination device illustrated in FIG. 17, illumination lamps, signal lights, car headlights, electronic displays, and the like.

FIG. 15 is an exploded perspective view illustrating a display device according to an embodiment.

Referring to FIG. 15, a display device 1000 according to the embodiment may include a light guide plate 1041, a light emitting module 1031 providing light to the light guide plate 1041, a reflection member 1022 under the light guide plate 1041, an optical sheet 1051 on the light guide plate 1041, a display panel 1061 on the optical sheet 1051, and a bottom cover 1011 storing the light guide 1041, the light emitting module 1031, and the reflection member 1022; however, it is not limited to this.

The bottom cover 1011, the reflection sheet 1022, the light guide plate 1041, and the optical sheet 1051 may be defined as a light unit 1050.

The light guide plate 1041 serves to diffuse light for convergence to a surface light source. The light guide plate 1041 is formed with transparent material and, e.g., may include one of acrylic resin such as polymethyl metaacrylate (PMMA), polyethylene terephthlate (PET), poly carbonate (PC), cycloolefin copolymer (COC), and polyethylene naphthalate (PEN) resins.

The light emitting module 1031 provides light to at least one side of the light guide plate 1041 and ultimately acts as a light source of the display device.

At least one light emitting module 1031 is included, and it may provide light directly or indirectly at one side of the light guide plate 1041. The light emitting module 1031 includes a substrate 1033 and the light emitting device package 30 according to the above-disclosed embodiment. The light emitting device package 30 may be arrayed at predetermined intervals on the substrate 1033.

The substrate 1033 may be a Printed Circuit Board (PCB) including a circuit pattern (not illustrated). However, the substrate 1033 may include not only the typical PCB but also a metal core PCB (MCPCB) and a flexible PCB (FPCB), and it is not limited to this. In the case that the light emitting device package 30 is installed on the side of the bottom cover 1011 or on a heat radiating plate, the substrate 1033 may be eliminated. Herein, a part of the heat radiating plate may be contacted to an upper surface of the bottom cover 1011.

The plurality of light emitting device packages 30 may be installed on the substrate 1033 so that a light-emitting surface is separated from the light guide plate 1041 by a predetermined distance, and there is no limit for this. The light emitting device package 30 may provide light to a light-entering part, i.e., one side, of the light guide plate 1041 directly or indirectly, and there is no limit for this.

The reflection member 1022 may be disposed under the light guide plate 1041. The reflection member 1022 reflects the light incident to the lower surface of the light guide plate 1041 in an upward direction so that brightness of the light unit 1050 may be improved. The reflection member 1022 may be formed with, e.g., PET, PC, PVC (polyvinyl chloride) resins;

however, it is not limited to this. The reflection member 1022 may be the upper surface of the bottom cover 1011; however, there is no limit for this.

The bottom cover 1011 may store the light guide plate 1041, the light emitting module 1031, and the reflection member 1022. To this end, the bottom cover 1011 may be provided with a storing unit 1012 having a shape of a box whose upper surface is open, and there is not limit for this. The bottom cover 1011 may be combined with a top cover, and there is no limit for this.

The bottom cover 1011 may be formed with metal material or resin material and may be fabricated using processes of press or extrusion molding. The bottom cover 1011 may also include metal or non-metal material having good thermal conductivity, and there is no limit for this.

The display panel 1061 is, e.g., an LCD panel, and includes transparent first and second substrates, and a liquid crystal layer between the first and second substrates. On at least one side of the display panel 1061, a polarizing plate may be attached; however, the attaching structure is not limited to this. The display panel 1061 displays information by the light which passes through the optical sheet 1051. The display device 1000 may be applied to various cell phones, monitors of notebook computers, monitors of laptop computers, and televisions.

The optical sheet 1051 is disposed between the display panel 1061 and the light guide plate 1041 and includes at least one translucent sheet. The optical sheet 1051 may include at least one of, e.g., diffusion sheet, horizontal and vertical prism sheets, and brightness enhancement sheet. The diffusion sheet diffuses the incident light. The horizontal or/and vertical prism sheet concentrates the incident light to a display region. The brightness enhancement sheet reuses lost light to enhance brightness. A protection sheet may be disposed on the display panel 1061, and there is no limit for this.

Herein, on the light path of the light emitting module 1031, the light guide plate 1041 and the optical sheet 1051 may be included as optical members; however, there is no limit for this.

FIG. 16 is a diagram illustrating a display device according to an embodiment.

Referring to FIG. 16, a display device 1100 includes a bottom cover 1152, a substrate 1120, an optical member 1154, and a display panel 1155. Herein, the above-disclosed light emitting device packages 30 are arrayed on the substrate 1120.

The substrate 1120 and the light emitting device package 30 may be defined as a light emitting module 1060. The bottom cover 1152, at least one light emitting module 1060, and the optical member 1154 may be defined as a light unit.

The bottom cover 1152 may be provided with a storing unit 1153, and there is no limit for this.

Herein, the optical member 1154 may includes at least one of the lens, light guide plate, diffusion sheet, horizontal and vertical prism sheets, and brightness enhancement sheet. The light guide plate may be formed with PC material or polymethyl metaacrylate (PMMA) material, and this light guide plate may be eliminated. The diffusion sheet diffuses the incident light. The horizontal or/and vertical prism sheet concentrates the incident light to the display region. The brightness enhancement sheet reuses lost light to enhance brightness.

The optical member 1154 is disposed on the light emitting module 1060. The optical member 1154 converts the light emitted from the light emitting module 1060 to the surface light source, or performs diffusing and concentrating light.

FIG. 17 is a perspective view illustrating an illumination device according to an embodiment.

Referring to FIG. 17, an illumination device 1500 may include a case 1510, a light emitting module 1530 installed to the case 1510, and a connection terminal 1520 installed to the case 1510 and provided with power from an external power source.

It is preferable to form the case 1510 with material which has good heat radiation characteristics. For instance, the case 1510 may be formed with metal material or resin material.

The light emitting module 1530 may include a substrate 1532 and the light emitting device package 30 according to the embodiment installed on the substrate 1532. The plurality of light emitting device packages 30 may be arrayed in a matrix form or may be arrayed being separated from each other at predetermined intervals.

The substrate 1532 may be an insulator where a circuit pattern is printed. For instance, the substrate 1532 may include the PCB, metal core PCB, flexible PCB, ceramic PCB, and FR-4 substrate.

The substrate 1532 may also be formed with material which efficiently reflects light, or its surface may be coated with color, e.g., white and silver, which efficiently reflects light.

At least one light emitting device package 30 may be installed on the substrate 1532. Each of the light emitting device packages 30 may include at least one Light Emitting Diode (LED) chip. The LED chip may include a light emitting diode of visible light such as red, green, blue, or white or a UV light emitting diode which emits Ultra Violet (UV).

A combination of various light emitting device packages 30 may be disposed in the light emitting module 1530 for obtaining color tone and brightness. For instance, for securing high Color Rendering Index (CRI), a white light emitting diode, a red light emitting diode, and a green light emitting diode may be combined and disposed.

The connection terminal 1520 may be electrically connected to the light emitting module 1530 to supply power. The connection terminal 1520 is screwed to be connected to the external power source in a socket method; however, there is no limit for this. For instance, the connection terminal 1520 may be fog wed as a pin shape to be inserted into the external power source or may be connected to the external power source by a wire.

The method of manufacturing the light emitting device according to the embodiment includes forming a light emitting structure layer including a plurality of compound semiconductor layer on a substrate, forming a channel layer at an outer peripheral portion of a top surface of the light emitting structure layer, forming an electrode layer on the light emitting structure layer, forming a conductive support member on the electrode layer, removing the substrate, scribing the conductive support member along a chip boundary region of the light emitting structure layer by using a laser, and performing an etching process with respect to the chip boundary region. Through the laser scribing process, a protrusion projects from at least one edge of the conductive support member.

The embodiment can provide a semiconductor light emitting device and a method of manufacturing the same, capable of improving the product yield of the manufacturing process by performing an etching process after a laser scribing process.

According to the embodiment, the light extraction efficiency of the light emitting device can be improved, and the reliability for the light emitting device package including the light emitting device and the lighting system can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a light emitting structure layer including a first semiconductor layer, a second semiconductor layer under the first semiconductor layer and an active layer between the first and second semiconductor layers;
    an electrode electrically connected to the first semiconductor layer;
    an electrode layer under the light emitting structure layer;
    a conductive support member under the electrode layer;
    a first protrusion protruded from at least one edge of the conductive support member; and
    a channel layer disposed between a top surface of the conductive support member and a lower surface of the second semiconductor layer,
    wherein the channel layer includes an opening region under the lower surface of the second semiconductor layer and an outer portion extended outward beyond the lower surface of the second semiconductor layer,
    wherein the outer portion of the channel layer is located at a lower position than the lower surface of the second semiconductor layer,
    wherein the first protrusion includes at least one material constituting the electrode layer and the conductive support member,
    wherein the first protrusion has an outer side having a rough surface and an inner side contacted with the channel layer, the outer side opposite to the inner side, and
    wherein the first protrusion is located at an outer position than a lateral sidewall of the second semiconductor layer and is located at a lower position than a top surface of the light emitting structure layer.

2. The light emitting device of claim 1, wherein the first protrusion projects from at least one edge of the conductive support member in a vertical direction with respect to a lower surface of the light emitting structure layer.

3. The light emitting device of claim 1, further comprising a second protrusion projected beyond a bottom surface of the conductive support member from at least one lower edge of the conductive support member.

4. The light emitting device of claim 3, wherein the first and second protrusions are protruded in a direction opposite to each other from at least one lateral sidewall of the conductive support member.

5. The light emitting device of claim 3, wherein a portion of the second protrusion is located at a lower position than the bottom surface of the conductive support member and a portion of the first protrusion is located at a higher position than the top surface of the conductive support member.

6. The light emitting device of claim 1, wherein the first protrusion is formed in a plurality, wherein the plurality of first protrusions is spaced apart from each other.

7. The light emitting device of claim 1, wherein the first protrusion is formed of metal or at least two alloys.

8. The light emitting device of claim 1, wherein the first protrusion has a length of 10 µm or less from the at least one of edges of the conductive support member.

9. The light emitting device of claim 1, wherein the first protrusion corresponds to a lateral sidewall of the light emitting structure layer.

10. The light emitting device of claim 1, wherein the electrode layer is disposed in the opening region of the channel layer.

11. The light emitting device of claim 1, wherein the channel layer includes a transparent material.

12. The light emitting device of claim 1, wherein the first protrusion is located at an outer position than the channel layer and the inner side of the first protrusion has a rough surface.

13. A light emitting device comprising:
    a light emitting structure layer including a first semiconductor layer, a second semiconductor layer under the first semiconductor layer and an active layer between the first and second semiconductor layers;
    an electrode electrically connected to the first semiconductor layer;
    an electrode layer under the light emitting structure layer; and
    a conductive support member under a lower surface of the second semiconductor layer,
    wherein the conductive support member includes a first protrusion protruded from at least one edge of a top surface of the conductive support member and a recess region recessed inward from at least one outer lateral sidewall of the conductive support member,
    wherein the first protrusion includes at least one material constituting the electrode layer and the conductive support member,
    wherein the first protrusion has a rough surface and is located at an outer position than a lateral sidewall of the second semiconductor layer, and
    wherein the recess region is located at a lower position than a bottom surface of the electrode layer and is connected to the at least one outer lateral sidewall of the conductive support member.

14. The light emitting device of claim 13, wherein the first protrusion is formed in a plurality, and
    wherein the plurality of first protrusions is projected from different edges of the conductive support member.

15. The light emitting device of claim 14, further comprising a second protrusion projected from at least one edge of a bottom surface of the conductive support member.

16. The light emitting device of claim 15, wherein the first and second protrusions are protruded in a direction opposite to each other with respect to the at least one outer lateral sidewall of the conductive support member, and wherein a top portion of the second protrusion is located at a lower position than a lower surface of the conductive support member.

17. The light emitting device of claim 15, wherein the plurality of first protrusions is spaced apart from each other.

18. The light emitting device of claim 13, wherein the first protrusion corresponds to a lateral sidewall of the active layer.

19. The light emitting device of claim 13, wherein the first protrusion is located at an outer region than a vertically overlapping region with respect to the lower surface of the second semiconductor layer.

20. The light emitting device of claim 13, wherein the first protrusion is located at a higher position than the lower surface of the second semiconductor layer.

* * * * *